(12) United States Patent
Yamashita

(10) Patent No.: US 8,476,573 B2
(45) Date of Patent: Jul. 2, 2013

(54) PHOTOELECTRIC CONVERSION FILM-STACKED TYPE SOLID-STATE IMAGING DEVICE AND METHOD OF MANUFACTURING THE SAME

(75) Inventor: Hirofumi Yamashita, Kawasaki (JP)

(73) Assignee: Kabushiki Kaisha Toshiba, Tokyo (JP)

(*) Notice: Subject to any disclaimer, the term of this patent is extended or adjusted under 35 U.S.C. 154(b) by 285 days.

(21) Appl. No.: 12/861,238

(22) Filed: Aug. 23, 2010

(65) Prior Publication Data

US 2011/0049333 A1 Mar. 3, 2011

(30) Foreign Application Priority Data

Aug. 25, 2009 (JP) ................ 2009-194543

(51) Int. Cl.
*H01L 31/00* (2006.01)
(52) U.S. Cl.
USPC ........................................... 250/214.1
(58) Field of Classification Search
USPC ...... 348/294; 250/208.1, 214.1; 257/431–466
See application file for complete search history.

(56) References Cited

U.S. PATENT DOCUMENTS

| | | | | |
|---|---|---|---|---|
| 5,402,171 A | * | 3/1995 | Tagami et al. | 348/219.1 |
| 2004/0259010 A1 | * | 12/2004 | Kanbe | 430/67 |
| 2005/0219392 A1 | * | 10/2005 | Suzuki | 348/294 |
| 2006/0197172 A1 | * | 9/2006 | Oda | 257/444 |
| 2007/0018075 A1 | | 1/2007 | Cazaux et al. | |
| 2008/0296475 A1 | * | 12/2008 | Kim | 250/208.1 |

FOREIGN PATENT DOCUMENTS

| | | |
|---|---|---|
| CN | 1551365 A | 12/2004 |
| JP | 61-193479 | 8/1986 |
| JP | 2004-335626 | 11/2004 |
| JP | 2005-286115 | 10/2005 |
| JP | 2006-32670 | 2/2006 |
| JP | 2006-94263 | 4/2006 |
| JP | 2008-4684 | 1/2008 |

OTHER PUBLICATIONS

Jennifer Ouellette, "Silicon-Germanium Gives Semiconductors the Edge," 2002, The Industrial Physicist 22-25.*
Online Publications Catalog, Thirteenth Color Imaging Conference: Color Science a Engineering Systems, Technologies, and Applications, Nov. 2005, vol. 13, ISBN/ISSN: 0-89208-259-3, 6 pages.

(Continued)

*Primary Examiner* — Thanh Luu
*Assistant Examiner* — Renee Naphas
(74) *Attorney, Agent, or Firm* — Oblon, Spivak, McClelland, Maier & Neustadt, L.L.P.

(57) ABSTRACT

According to one embodiment, a solid-state imaging device with a plurality of light-receiving layers for acquiring different color signals stacked one on top of another in the optical direction. Each of the light-receiving layers includes a photoelectric conversion part that receives light entering the back side of the layer and generates signal charges and a read transistor that is provided on the front side of the layer and reads the signal charges generated at the photoelectric conversion part. A semiconductor layer is stacked via an insulating film on the front side of the top layer of the plurality of light-receiving layers. At the semiconductor layer, there is provided a signal scanning circuit which processes a signal read by each of the read transistors and outputs a different color signal from each of the light-receiving layers to the outside.

8 Claims, 9 Drawing Sheets

OTHER PUBLICATIONS

Perceval Coudrain, et al., Investigation of a Sequential Three-Dimensional Process for Back-Illuminated CMOS Image Sensors With Miniaturized Pixels, IEEE Transactions on Electron Devices, vol. 56, No. 11, Nov. 2009, 6 pages.

Office Action issued Feb. 21, 2012, in Japanese Patent Application No. 2009-194543 (with English-language translation).

Office Action issued Nov. 22, 2011, in Japanese Patent Application No. 2009-194543 (with English-language translation).

Combined Chinese Office Action and Search Report issued Jul. 11, 2012 in Chinese Patent Application No. 201010266785.9 (with English-language translation).

* cited by examiner

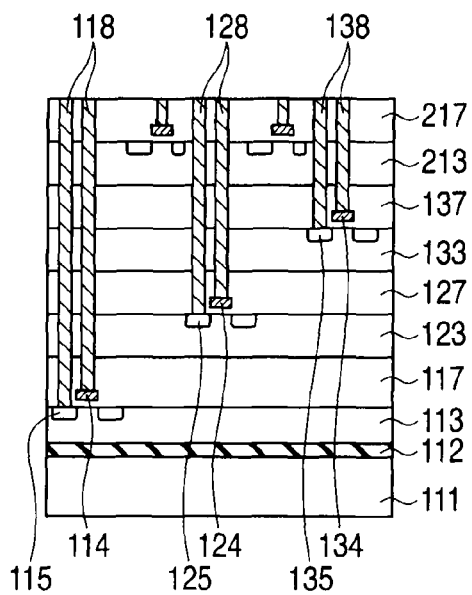
F I G. 7I
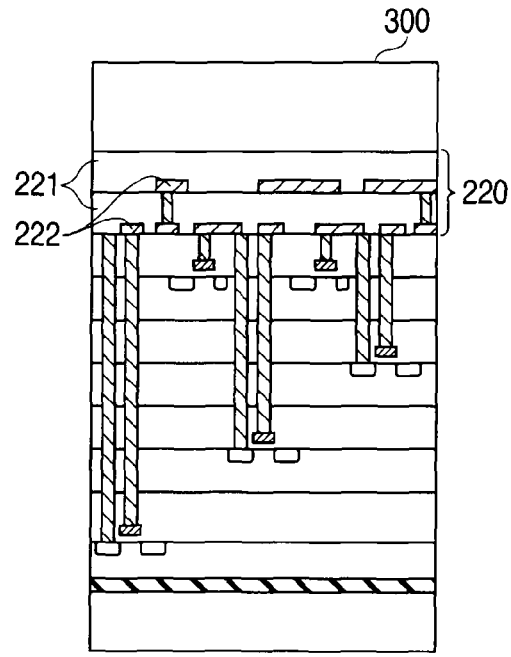
F I G. 7K
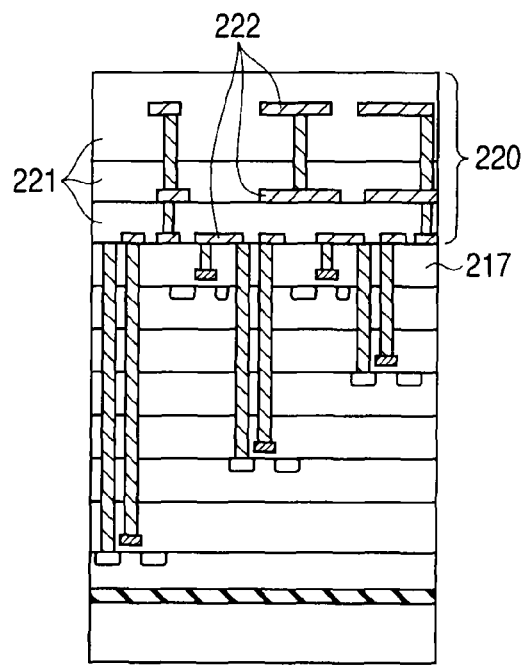
F I G. 7J
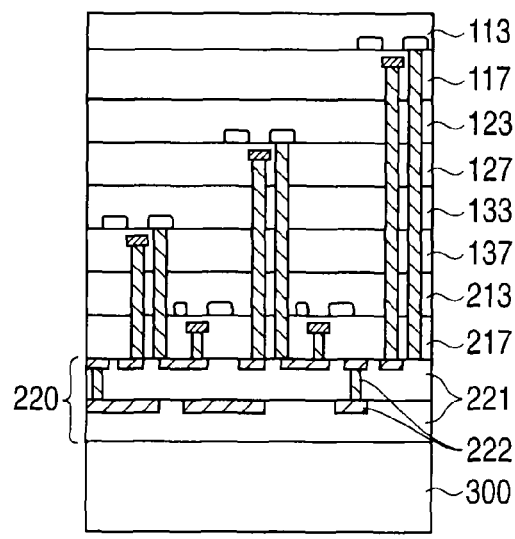
F I G. 7L

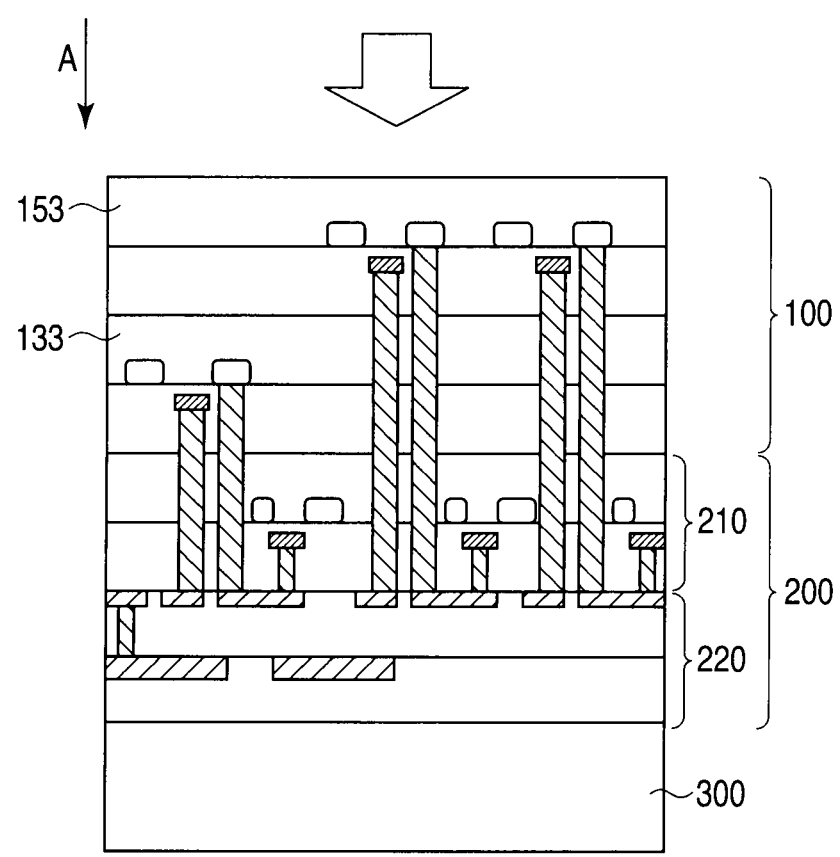
F I G. 10

PHOTOELECTRIC CONVERSION FILM-STACKED TYPE SOLID-STATE IMAGING DEVICE AND METHOD OF MANUFACTURING THE SAME

CROSS-REFERENCE TO RELATED APPLICATIONS

This application is based upon and claims the benefit of priority from Japanese Patent Application No. 2009-194543, filed Aug. 25, 2009; the entire contents of which are incorporated herein by reference.

FIELD

Embodiments described herein relate generally to a solid-state imaging device with a plurality of light-receiving layers stacked in the optical axis direction and a method of manufacturing the same.

BACKGROUND

In recent years, the demand for not only a reduction in the size of an imaging optical system but also a higher resolution has been increasing. To realize a reduction in the light-receiving region and an increase in the number of pixels at the same time, it is necessary to decrease the unit pixel size.

With this backdrop, a solid-state imaging device has been proposed in which a plurality of n-type diffusion layers are provided in the depth direction of an Si substrate and signal charges of different colors are accumulated in the individual diffusion layers. With the device, it is possible to obtain color information three times that offered by conventional pixels per unit Si area. However, since three adjacent signal accumulation regions are provided in the same Si substrate, electrons photoelectrically converted in the Si substrate flow in between laterally adjoining signal accumulation regions due to thermal diffusion. This results in a decrease in the resolution and color mixture in reproduced images, which deteriorates the image quality. Moreover, since both the photoelectric conversion region and the signal scanning region are provided in the same Si substrate, the area ratio of the photoelectric conversion region to the unit pixel size decreases, resulting in a decrease in the sensitivity.

In addition, a solid-state imaging device has been proposed in which a three-layer photoelectric conversion film sandwiched between transparent electrodes is provided above an Si substrate that includes an accumulation diode and a signal read circuit and a different color signal charge is accumulated in each of the individual photoelectric conversion films. In the device, photoelectrons generated at the photoelectric conversion film are accumulated temporarily in the accumulation diode via metal interconnections and then read by a signal scanning circuit. Consequently, three color signals can be obtained per unit pixel. However, since the metal interconnections are connected directly to the photoelectric conversion film, noise, such as kTC noise, is generated. As a result, a lot of noise is generated in reproduced images.

BRIEF DESCRIPTION OF THE DRAWINGS

FIGS. 6A and 6B show a pixel pitch for each color in the MOS solid-state imaging device of the first embodiment;

FIGS. 7A, 7B, 7C, 7D, 7E, 7F, 7G, 7H, 7I, 7J, 7K, and 7L are sectional views to explain the process of manufacturing the MOS solid-state imaging device of the first embodiment;

FIG. 10 is a sectional view showing the structure of a unit pixel in a MOS solid-state imaging device according to a fourth embodiment.

DETAILED DESCRIPTION

In general, according to one embodiment, there is provided a solid-state imaging device with a plurality of light-receiving layers for acquiring different color signals stacked one on top of another in the optical direction. Each of the light-receiving layers includes a photoelectric conversion part that receives light entering the back side of the layer and generates signal charges and a read transistor that is provided on the front side of the layer and reads the signal charges generated at the photoelectric conversion part. A semiconductor layer is stacked via an insulating film on the front side of the top layer of said plurality of light-receiving layers. At the semiconductor layer, there is provided a signal scanning circuit which processes a signal read by each of the read transistors and outputs a different color signal from each of the light-receiving layers to the outside.

Hereinafter, embodiments will be explained with reference to the accompanying drawings.

First Embodiment

Figure 1:
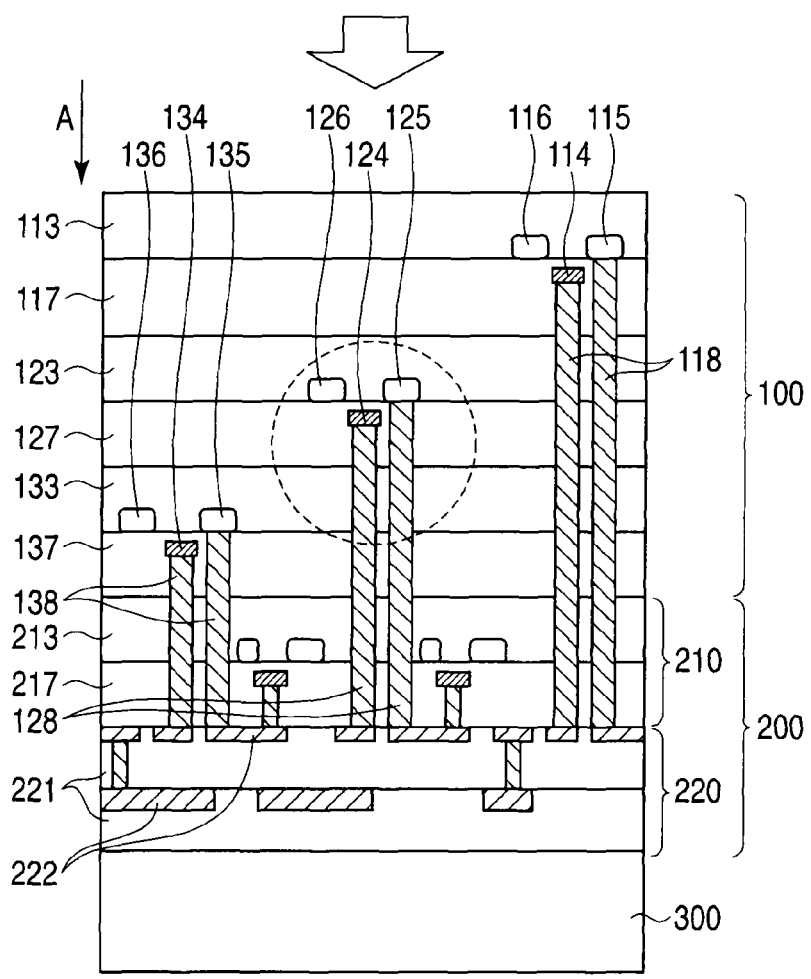
FIG. 1 is a sectional view showing the structure of a unit pixel in a MOS solid-state imaging device according to a first embodiment.

FIG. 1 is a sectional view showing the structure of a unit pixel in a MOS solid-state imaging device according to a first embodiment. Although not shown in FIG. 1, unit pixels are arrayed two-dimensionally in an X direction (a right-to-left direction in FIG. 1) and a Y direction (a front-to-back direction in FIG. 1).

In FIG. 1, three layers of crystalline Si acting as a light-receiving layer 100 are stacked in the optical axis direction A in such a manner that they are separated from one another, with an insulating film between them. In a first Si layer closest to the optical incidence side, a signal mostly based on blue light is generated by photoelectric conversion. In a second Si layer under the first Si layer, a signal mostly based on green light is generated by photoelectric conversion. In a third Si layer under the second Si layer, a signal mostly based on red light is generated by photoelectric conversion.

Specifically, at the surface (lower side) of a first Si layer 113, a read gate 114, an n-type diffusion layer 116 constituting a photodiode, and an n-type diffusion layer 115 serving as a floating diffusion layer are formed. The read gate 114, n-type diffusion layer 116, and n-type diffusion layer 115 constitute a read transistor. A second Si layer 123 is caused to adhere to the surface (lower side) of the Si layer 113 via a first interlayer insulating film 117. At the surface (lower side) of the second Si layer 123, a read gate 124, an n-type diffusion layer 126 constituting a photodiode, and an n-type diffusion layer 125 serving as a floating diffusion layer are formed. The read gate 124, n-type diffusion layer 126, and n-type diffusion layer 125 constitute a read transistor. A third Si layer 133 is caused to adhere to the surface (lower side) of the Si layer 123 via a second interlayer insulating film 127. At the surface (lower side) of the third Si layer 133, a read gate 134, an n-type diffusion layer 136 constituting a photodiode, and an n-type diffusion layer 135 serving as a floating diffusion layer are formed. The read gate 134, n-type diffusion layer 136, and n-type diffusion layer 135 constitute a read transistor.

A fourth Si layer (semiconductor layer) 213 is caused to adhere to the surface (lower side) of the Si layer 133 via a third interlayer insulating film 137. At the surface (lower side) of the Si layer 213, various transistors to constitute a signal scanning circuit 210 are formed. On the surface of the Si layer 213, a fourth interlayer insulating film 217 is formed. On the surface of the interlayer insulating film 217, an interconnection layer 220 composed of a fifth interlayer insulating film 221 and metal interconnections 222 is formed. Then, a support substrate 300 is caused to adhere onto the surface of the interconnection layer 220.

The signal scanning circuit 210 composed of the Si layer 213, various transistors, and interlayer insulating film 217 and the interconnection layer 220 composed of the interlayer insulating film 221 and metal interconnections 222 constitute a signal scanning circuit part 200. The signal scanning circuit part 200 and the light-receiving layer 100 are connected to each other with vias 118, 128, and 138.

Figure 2:
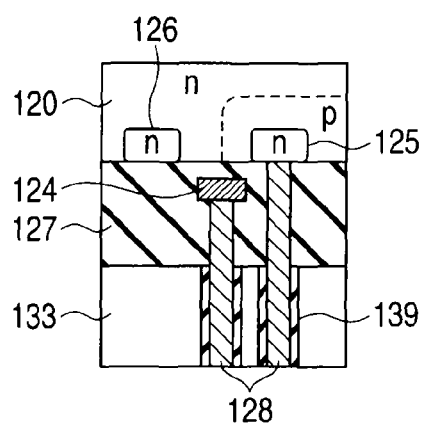
FIG. 2 is an enlarged sectional view of a via part in the solid-state imaging device of FIG. 1.

FIG. 2 is an enlarged view of the via hole part enclosed by a broken line in FIG. 1. The via holes are made so as to penetrate the crystalline Si (Si layer 133) and an insulating film 139 is formed between the vias 128 and the Si layer 133 so as to prevent metal of which the vias 128 are made from short-circuiting with the Si layer 133.

This structure produces the following effect. Since three light-receiving layers are stacked per unit pixel area, three color signals can be obtained per pixel. Accordingly, high-color-resolution images can be obtained. Since the individual color light-receiving regions are provided in separate Si layers, crosstalk caused as a result of the leakage of signal electrons into adjacent different color pixels by the thermal diffusion of photoelectrons does not take place. Consequently, reproduced images with good color reproducibility can be obtained.

In addition, since light is received, photoelectric conversion is performed, and signal electrons are read from the photodiode in the crystalline Si layer, no signal electron is left in a read operation. Accordingly, since neither afterimages nor kTC noise is generated, reproduced images with less noise can be obtained. The light-receiving region and the signal scanning circuit are provided in separate Si layers, enabling the area of the photodiode provided in the light receiving layer to be made larger. Consequently, the number of accumulable signal electrons increases, making it possible to make the number of saturated elections sufficiently large.

Figure 3A:
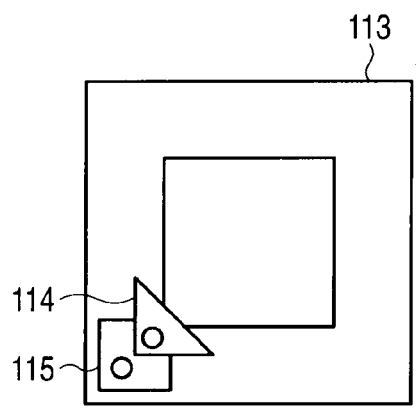
FIGS. 3A, 3B, 3C and 3D show a planar structure of a unit pixel with the structure of FIG. 1.
Figure 3B:
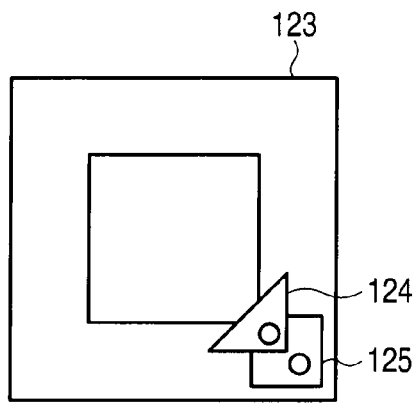
Figure 3D:
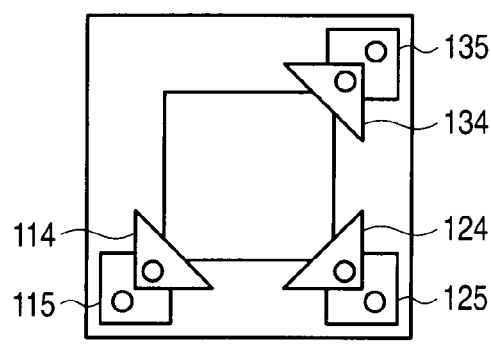

FIGS. 3A to 3D show a planar layout of a unit pixel with the structure of FIG. 1 viewed from a direction perpendicular to the optical axis. Each of FIGS. 3A to 3C separately shows an Si layer for obtaining each color signal. FIG. 3D shows the three light-receiving Si layers stacked one on top of another in the optical axis direction.

Figure 3C:
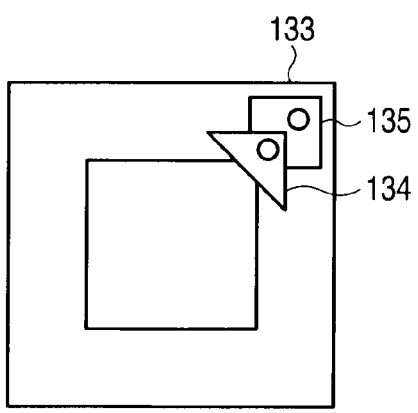

As shown in FIG. 3A, in the blue (B) signal acquisition Si layer 113, a read transistor (read gate) 114 and a floating diffusion layer 115 are formed at the bottom left of the pixel. As shown in FIG. 3B, in the green (G) signal acquisition Si layer 123, a read transistor (read gate) 124 and a floating diffusion layer 125 are formed at the bottom right of the pixel. As shown in FIG. 3C, in the red (R) signal acquisition Si layer 133, a read transistor (read gate) 134 and a floating diffusion layer 135 are formed at the top right of the pixel.

In FIG. 3D where those layers are stacked one on top of another, the read transistors 114, 124, 134 and floating diffusion layers 115, 125, 135 are located in the three corners of the rectangular pixel, with their interconnections making no contact with one another.

Figure 4:
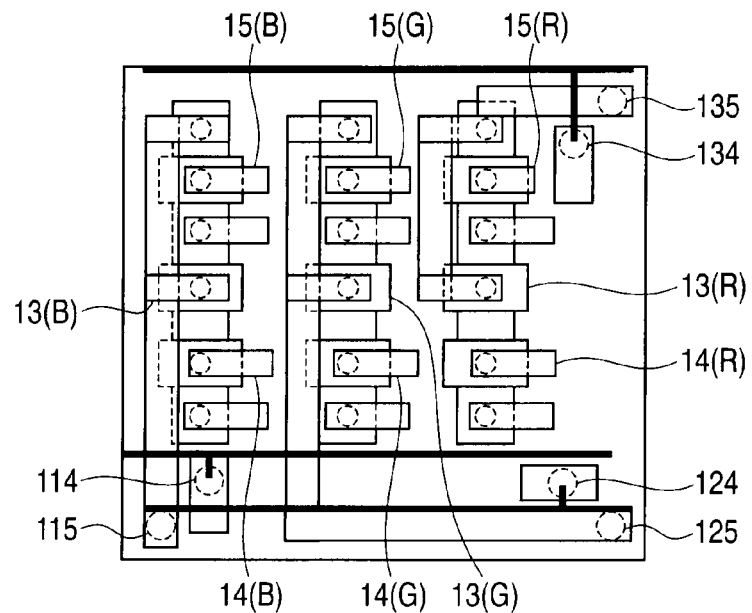
FIG. 4 shows a planar structure of a signal scanning circuit part corresponding to a unit pixel with the structure of FIG. 1.

FIG. 4 shows the signal scanning circuit viewed from the optical axis direction. In one pixel region, transistors 13 to 15 corresponding to three layers of RGB are formed. Specifically, the gate of the amplification transistor 13 (B) and the source of the reset transistor 15 (B) are connected to the floating diffusion layer 115 of FIG. 3. The gate of the amplification transistor 13 (G) and the source of the reset transistor 15 (G) are connected to the floating diffusion layer 125. The gate of the amplification transistor 13 (R) and the source of the reset transistor 15 (R) are connected to the floating diffusion layer 135.

Figure 5:
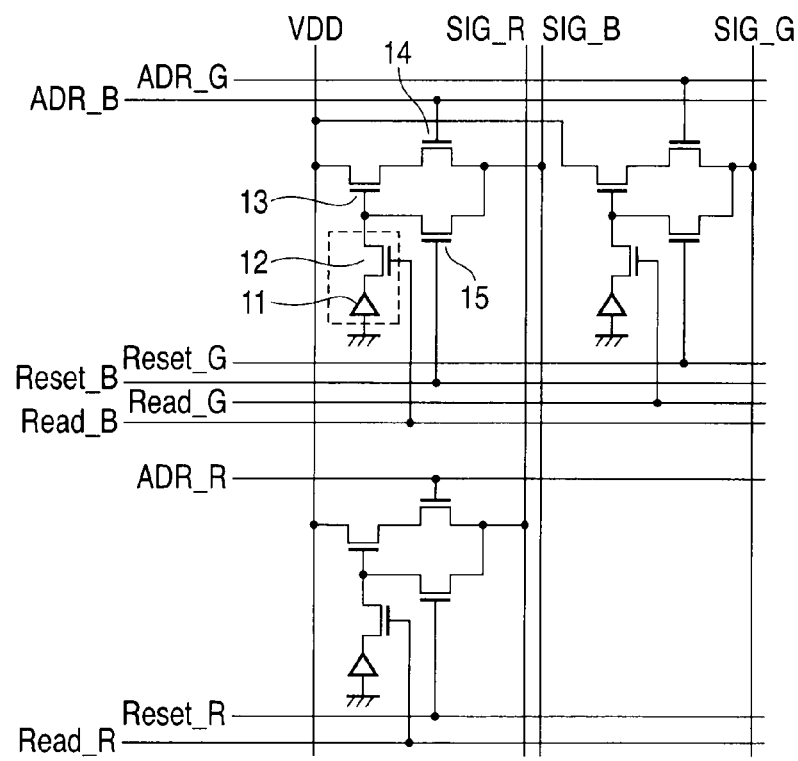
FIG. 5 shows a circuit configuration of a unit pixel in the MOS solid-state imaging device of the first embodiment.

FIG. 5 is an equivalent circuit diagram showing the circuit configuration of a unit pixel of the first embodiment.

In a unit pixel, there are provided a photodiode 11 for photoelectric conversion, a read transistor 12 for reading a signal from the photodiode 11, an amplification transistor 13 for amplifying the read signal, a vertical select transistor 14 for selecting a line from which a signal is to be read, and a reset transistor 15 for resetting signal charges. The photodiode 11 and read transistor 12 are formed in Si layers 113, 123, 133. The connection part between the read transistor 12 and amplification transistor 13 is a floating diffusion layer.

Horizontal address lines ADR-G, ADR-B, ADR-R wired horizontally from a vertical shift register (not shown) are connected to the gates of the corresponding vertical select transistors 14 and determine a line from which a signal is to be read. Reset lines RESET-G, RESET-B, RESET-R are connected to the gates of the corresponding reset transistors 15. Read lines READ-G, READ-B, READ-R are connected to the gates of the corresponding read transistors 12.

The amplification transistor 13 has its source connected to VDD and its drain connected to the source of the vertical select transistor 14. The drain of the vertical select transistor 14 is connected to each of SIG-R, SIG-G, and SIG-B.

With this configuration, the select transistor 14 in the row to be read is turned on by row selection pulses sent from the horizontal address lines ADR-G, ADR-B, and ADR-R. Then, the reset transistor 15 is turned on by reset pulses sent from the reset lines RESET-G, RESET-B, and RESET-R, thereby resetting the potential of the floating diffusion layer. Then, the reset transistor 15 turn off. Thereafter, the read transistor 12 turn on, causing the signal charges stored in the photodiode 11 to be read into the floating diffusion layer. Then, the potential of the floating diffusion layer is modulated according to the number of signal charges read. The modulated signal is read onto the vertical signal line.

Figures 6A, 6B:
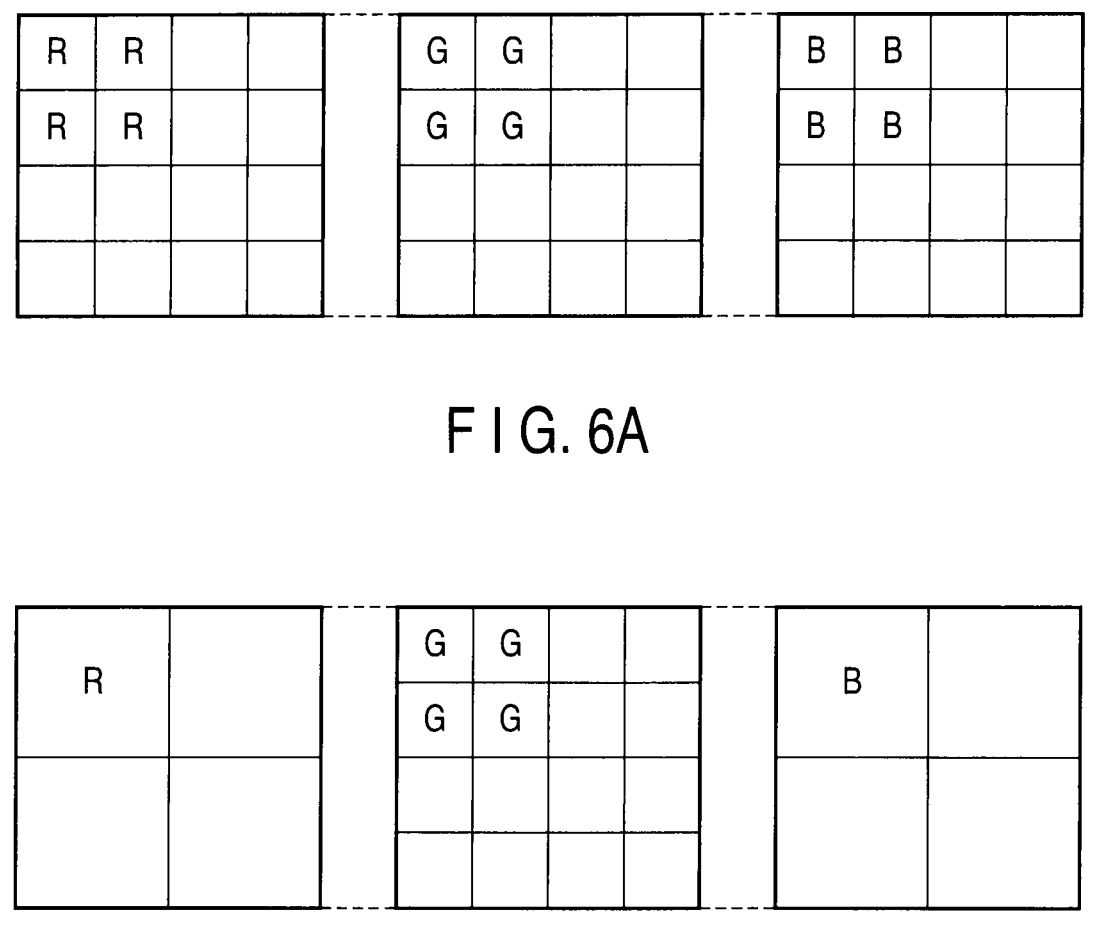

FIGS. 6A and 6B show a pixel pitch of each color in the MOS solid-state imaging device of the first embodiment. Like FIG. 4, FIG. 6A shows a case where the area occupied by unit pixels of each of R, G, and B is the same. FIG. 6B shows a case where the pitch of unit pixels that get mostly green signals is halved.

In the first embodiment, since a different Si light-receiving layer is provided for each color, pixels can be arranged in a different pitch for each color. As described above, with the first embodiment, since the pitch of obtaining a color signal can be changed independently on a color basis, for example, the resolution of only a G signal can be increased, enabling a high-resolution luminance signal to be obtained. The pitch of only pixels that obtain green signals has been made different in FIG. 6B. The same holds true for the other colors.

Next, a method of manufacturing the solid-state imaging device of the first embodiment will be explained with reference to FIGS. 7A to 7L.

Figure 7A:
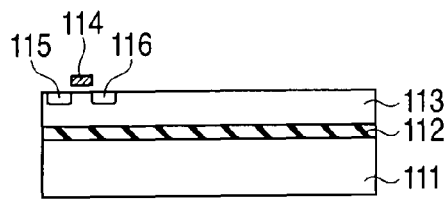

As shown in FIG. 7A, a silicon-on-insulator (SOI) substrate where a first Si layer 113 has been provided above an Si single-crystal substrate 111 via an insulating film 112 made of $SiO_2$ is prepared. Then, at the surface of the Si layer 113, an n-type diffusion layer 116 constituting a photodiode and an n-type diffusion layer 115 acting as a floating diffusion layer are formed. A MOS gate electrode 114 made of polysilicon is formed at the surface of the Si layer 113 so as to be adjacent to the n-type diffusion layers, 116, 115, thereby forming the read transistor 12.

Figure 7B:
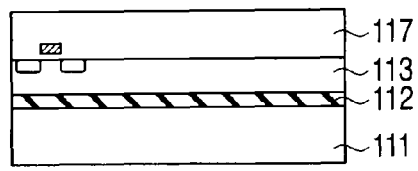

Next, as shown in FIG. 7B, a first interlayer insulating film 117 composed of a TEOS film or the like is deposited on the surface of the Si layer 113.

Figure 7C:
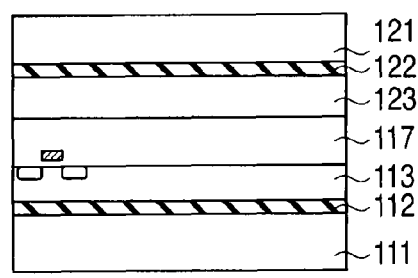

Then, as shown in FIG. 7C, an SOI substrate where a second Si layer 123 has been provided above an Si single-crystal substrate 121 via an insulating film 122 made of $SiO_2$ is prepared and the Si layer 123 is laminated onto the interlayer insulating film 117.

Figure 7D:
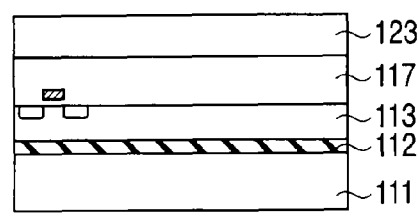

Next, as shown in FIG. 7D, of the laminated SOI substrate, only the Si substrate 121 and insulating film 122 are removed so as to leave only the crystalline Si layer 123 on the insulating film 117.

Figure 7E:
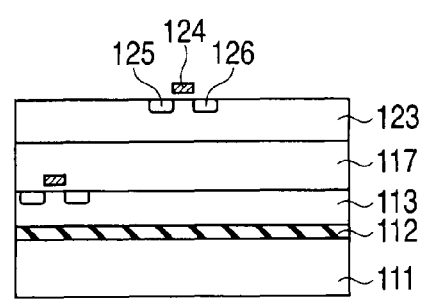

Then, as shown in FIG. 7E, on the Si layer 123, a photodiode 126, a floating diffusion layer 125, and a MOS gate 124 are formed in the same manner as described above.

Figure 7F:
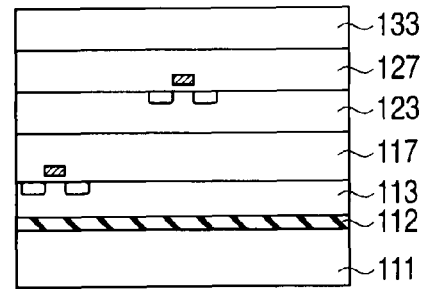

Next, as shown in FIG. 7F, a second interlayer insulating film 127 composed of a TEOS film or the like is formed. On the second interlayer insulating film 127, a third Si layer 133 is formed.

Figure 7G:
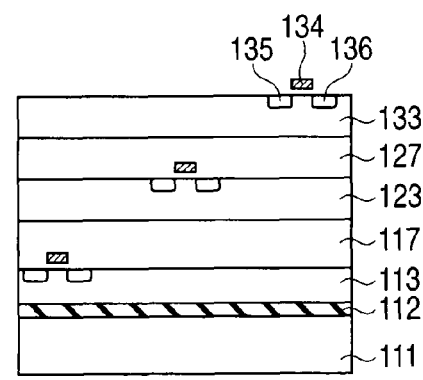

Then, as shown in FIG. 7G, a photodiode 136, a floating diffusion layer 135, and a read gate 134 are formed in the crystalline layer 133 in the same manner as described above.

Figure 7H:
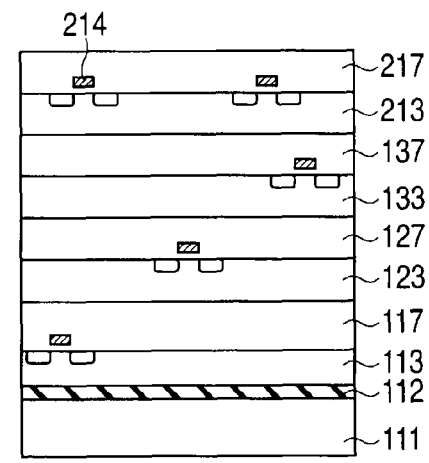

Next, as shown in FIG. 7H, a third insulating film 137 and a fourth Si layer 213 are formed on the Si layer 13 in the same manner as described above, thereby forming an n-type diffusion layer and a MOS gate. In the Si layer 213, an S/D region composed of a n-type diffusion layer and a MOS gate 214 made of polysilicon are formed. They function as signal scanning circuits constituting the row select transistor 14, amplification transistor 13, and reset transistor 15 when the device is operating. Then, on the Si layer 213, a fourth interlayer insulating film 217 composed of a TEOS film or the like is formed.

Next, as shown in FIG. 7I, via holes and Si through vias are formed so as to extend from the surface of the top insulating film 217. Specifically, in the B signal acquisition layer, via holes that penetrate the insulating films 217, 137, 127, 117 and Si layers 213, 133, 123 are made and vias 118 that connect with the gate electrode 114 and diffusion layer 115 are formed. In the G signal acquisition layer, via holes that penetrate the insulating films 217, 137, 127 and Si layers 213, 133 are made and vias 128 that connect with the gate electrode 124 and diffusion layer 125 are formed. In the R signal acquisition layer, via holes that penetrate the insulating films 217, 137 and Si layer 213 are made and vias 138 that connect with the gate electrode 134 and diffusion layer 135 are formed.

Then, as shown in FIG. 7J, on the insulating film 217, an interconnection layer 220 composed of metal interconnections 222 connected to Si through vias and insulating films 221 is formed.

Then, as shown in FIG. 7K, a support substrate 300 is caused to adhere onto the interconnection layer 220. In FIG. 7K, a part of the metal interconnections in the interconnection layer 220 is not shown.

Next, as shown in FIG. 7L, the Si substrate 111 and insulating film 112 of the SOI substrate are peeled from the Si layer 113, thereby exposing the back side of the Si layer 113. Then, microlenses and others are formed on the exposed back side of the Si layer, which completes the solid-state imaging device.

As described above, with the first embodiment, the Si layers 113, 123, 133 for obtaining R, G, B color signals are stacked in the optical axis direction of the imaging optical system in such a manner that they are separated from one another with insulating films. Therefore, the number of color signals obtained per unit pixel trebles. Since there is no interconnection layer on each of the light-receiving layers 113, 123, 133, a high quantum efficiency can be realized. Accordingly, the sensitivity and resolution can be improved.

In addition, since the Si layers 113, 123, 133 for obtaining the individual color signals are separated from one another with insulating films, no electric crosstalk takes place, which makes it possible to obtain color signals with less color mixture.

Furthermore, the signal charges generated by photoelectric conversion at each of the Si layers 113, 123, 133 are read temporarily into a floating diffusion layer provided in the same Si layer via a read gate provided in the same Si layer as the light-receiving Si layer. Then, the signal charges read into the floating diffusion layer are carried by an interconnection to an Si layer different from the Si light-receiving layer and are read by the signal scanning circuit. Consequently, the photodiode area is large, which makes it possible to make the saturated charge amount large and realize reproduced images free from kTC noise and afterimages.

Second Embodiment

Figure 8:
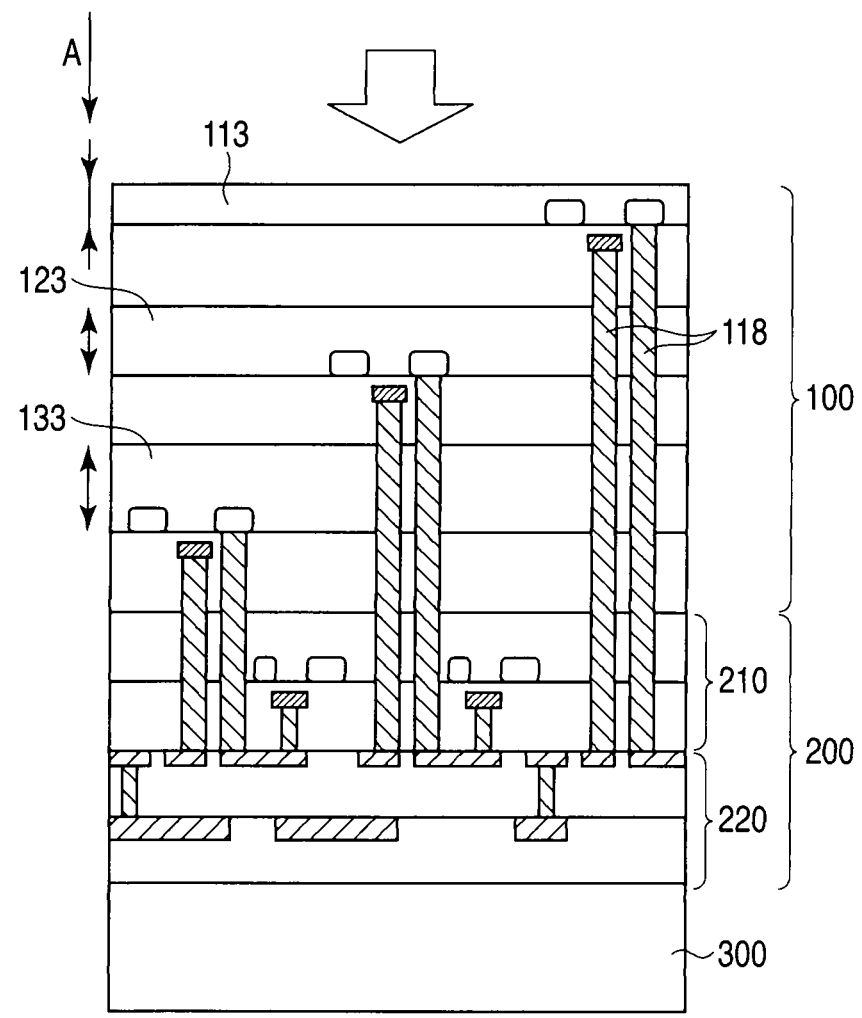
FIG. 8 is a sectional view showing the structure of a unit pixel in a MOS solid-state imaging device according to a second embodiment.

FIG. 8 is a sectional view showing the configuration of a unit pixel in a MOS solid-state imaging device according to a second embodiment. In FIG. 8, the same parts as those in FIG. 1 are indicated by the same reference numbers and a detailed explained of them will be omitted.

The basic configuration of the second embodiment is the same as that of the first embodiment explained above. The second embodiment differs from the first embodiment in the thickness of the Si layer serving as a light-receiving layer.

In the second embodiment, the first Si layer 113 for receiving mostly blue light is thinner than the other Si layers 123, 133. The second Si layer 123 for receiving mostly green light is thicker than the first Si layer 113 for receiving blue light and thinner than the third Si layer 133 for receiving mostly red light.

With this configuration, not only is the same effect of the first embodiment obtained, but also the following effect is obtained. Since the first Si layer 113 for obtaining a blue signal is made thinner, the light-receiving efficiency of light (green, red) on the long-wavelength side at the Si layer 113 decreases. Accordingly, a blue signal with less color mixture on the long-wavelength side is obtained. In addition, since the Si layer 123 for obtaining a green signal is made thinner than the Si layer 133, the light-receiving efficiency of light (red) at the Si layer 123 decreases. Therefore, a green signal with less color mixture on the long-wavelength side is obtained. Accordingly, the color reproducibility can be improved.

Third Embodiment

Figure 9:
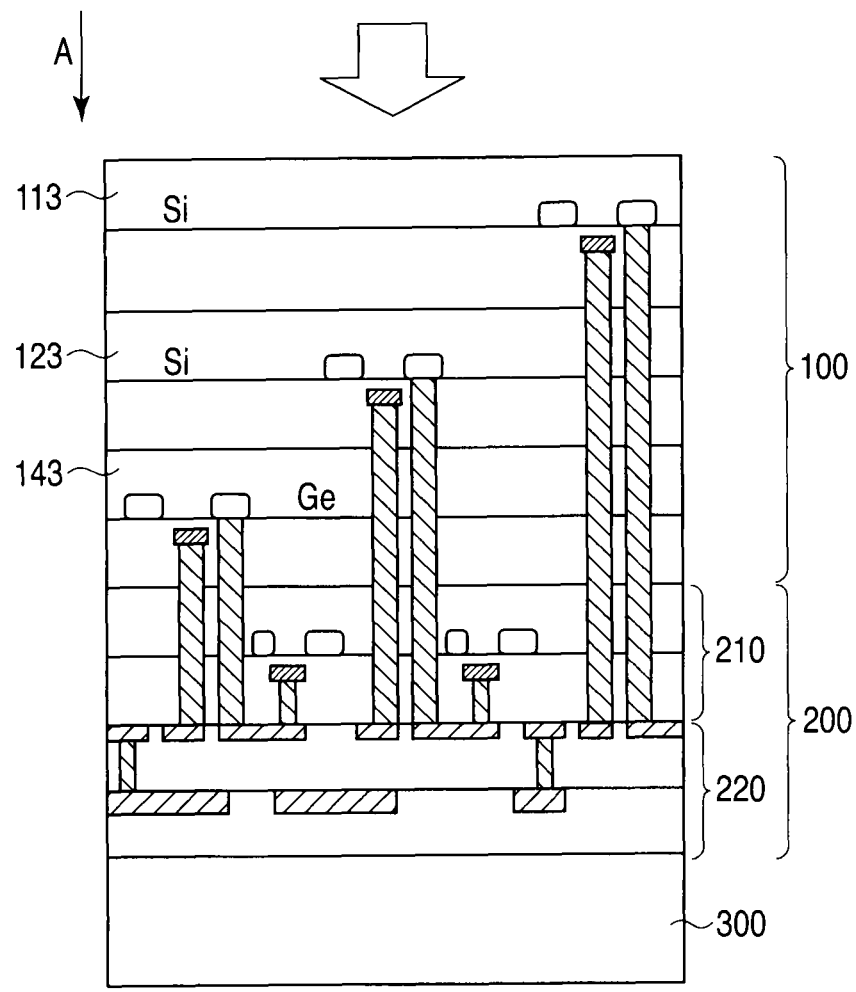
FIG. 9 is a sectional view showing the structure of a unit pixel in a MOS solid-state imaging device according to a third embodiment.

FIG. 9 is a sectional view showing the configuration of a unit pixel in a MOS solid-state imaging device according to a third embodiment. In FIG. 9, the same parts as those in FIG. 1 are indicated by the same reference numbers and a detailed explained of them will be omitted.

In the third embodiment, three semiconductor layers serving as light-receiving layers are stacked in the optical axis direction A in such a manner that they are separated from one another, with insulating films between them as shown in FIG. 1. The third embodiment differs from the first embodiment in that the semiconductor layers serving as the individual light-receiving layers each have a different bandgap.

The third embodiment is explained, taking as an example a case where a semiconductor layer for receiving mostly blue light is the Si layer 113, a semiconductor layer for receiving mostly green light is the Si layer 123, and a semiconductor layer for receiving mostly red light is the Si layer 143.

With this configuration, the light-receiving efficiency of light (red) on the long-wavelength side at the Ge layer 133 for obtaining a red signal increases, which makes it possible to realize an imaging device with a high sensitivity on the long-wavelength side.

Fourth Embodiment

FIG. 10 is a sectional view showing the configuration of a unit pixel in a MOS solid-state imaging device according to a fourth embodiment. In FIG. 10, the same parts as those in FIG. 1 are indicated by the same reference numbers and a detailed explained of them will be omitted.

In the fourth embodiment, crystalline Si layers serving as light-receiving layers are stacked in the optical axis direction A in such a manner that they are separated from each other, with an insulating film between them as shown in FIG. 1. The fourth embodiment differs from the first embodiment in that the number of crystalline Si layers serving as light-receiving layers is not three but two. Specifically, in the fourth embodiment of FIG. 10, a first and second Si layer for receiving mostly blue light and green light, respectively, are composed of a single crystalline Si layer 153.

With this configuration, a blue signal spectroscopic characteristic and a green signal spectroscopic characteristic combine to produce a good spectroscopic characteristic with no color mixture on the long-wavelength side, which offers the advantage of producing good reproduced images with a high color reproducibility. As described above, the number of light-receiving layers stacked is not restricted to three and may be two or four.

(Modification)

This invention is not limited to the above embodiments. While in the embodiment, various transistors are of the n-type, they may be of the p-type. The circuit configuration of the signal scanning circuit is not restricted to FIGS. 4 and 5 and may be changed according to the specification. Furthermore, a semiconductor layer for forming a light-receiving layer is not necessarily limited to an Si substrate. Other semiconductor materials may be used instead.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device comprising:
a plurality of light-receiving layers stacked in an optical axis direction via insulating films and each obtain a different color signal and each including a photoelectric conversion part that receives light entering the back side of the layer and generates signal charges and a read transistor that is provided on the front side of the layer and reads the signal charges generated at the photoelectric conversion part;
a semiconductor layer stacked via an insulating film on the front side of the top layer of said plurality of light-receiving layers;
a signal scanning circuit provided at the semiconductor layer and processing a signal read by each of the read transistors and outputs a different color signal from each of the light-receiving layers to the outside;
vias made so as to penetrate at least one of the insulating films and connecting the read transistors in the individual light-receiving layers to the signal scanning circuit; and
an interconnection layer on one side of the signal scanning circuit opposite the light-receiving layers and comprising a plurality of interconnections, wherein the vias are connected to one of the interconnections of the interconnection layer and to the signal scanning circuit via the interconnection layer,
wherein the light-receiving layers comprise a lower receiving layer and an upper receiving layer and light enters a back side of the bottom light-receiving layer via an imaging optical system, and
color signals generated at the lower receiving layer is a signal with a predominant wavelength of blue and green, and color signals generated at the upper receiving layer is a signal with a predominant wavelength of red.

2. The device according to claim 1, wherein the vias are made so as to penetrate the light-receiving layers higher than the light-receiving layers in which the read transistor to be connected to the vias has been formed and are electrically isolated from the higher light receiving layers.

3. The device according to claim 1, wherein the light-receiving layers comprise three layers corresponding to blue, green, and red, and the light-receiving layers corresponding to blue and red have a unit pixel pitch greater than that of one of the light-receiving layers corresponding to green.

4. The device according to claim 1, wherein the number of the light-receiving layers is 3 and light enters the back side of the bottom light-receiving layer via an imaging optical system, and
color signals generated at the individual light-receiving layers are a signal with a predominant wavelength of blue, a signal with a predominant wavelength of green, and a signal with a predominant wavelength of red in that order, starting with the light-receiving layer closest to the imaging optical system.

5. The device according to claim 1, wherein the light-receiving layers comprise a first receiving layer and a second receiving layer and a third receiving layer from an incident side of the light, the film thickness of the first receiving layer is less than that of the second receiving layer and the film thickness of the second receiving layer is less than that of the third receiving layer.

6. The device according to claim 1, wherein each of the light-receiving layers includes a photodiode configured to accumulate a signal generated by photoelectric conversion, a read gate configured to read signal charges accumulated in the photodiode, and a floating diffusion layer configured to accumulate signal charges read via the read gate and converting the charges into a voltage.

7. The device according to claim 1, wherein the signal scanning circuit includes an amplification transistor configured to amplify signal charges read by the read transistor, a vertical select transistor configured to select a line from which signal charges amplified by the amplification transistor are to be read, and a reset transistor configured to reset signal charges read by the read transistor.

8. The device according to claim 1, wherein the light-receiving layers are all Si layers or partly an Si layer or layers and the rest is a Ge layer or layers.

* * * * *